United States Patent
Oki et al.

(10) Patent No.: US 7,468,877 B2
(45) Date of Patent: Dec. 23, 2008

(54) OVERCURRENT DETECTION CIRCUIT AND POWER SUPPLY APPARATUS PROVIDED THEREWITH

(75) Inventors: Hirokazu Oki, Kyoto (JP); Yuzo Ide, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 218 days.

(21) Appl. No.: 11/568,493

(22) PCT Filed: Apr. 28, 2005

(86) PCT No.: PCT/JP2005/008164

§ 371 (c)(1),
(2), (4) Date: Oct. 30, 2006

(87) PCT Pub. No.: WO2005/109589

PCT Pub. Date: Nov. 17, 2005

(65) Prior Publication Data

US 2007/0223164 A1    Sep. 27, 2007

(30) Foreign Application Priority Data

May 6, 2004  (JP) ............................. 2004-137072

(51) Int. Cl.
*H02H 3/08* (2006.01)
*H02H 3/00* (2006.01)
*H02H 3/27* (2006.01)

(52) U.S. Cl. ........................ 361/93.1; 361/94; 361/91.3

(58) Field of Classification Search ................ 361/93.1, 361/94

See application file for complete search history.

(56) References Cited

U.S. PATENT DOCUMENTS

| | | | |
|---|---|---|---|
| 5,291,384 A * | 3/1994 | Mammano et al. | 363/17 |
| 6,127,882 A | 10/2000 | Vargha et al. | |
| 6,320,275 B1 | 11/2001 | Okamoto et al. | |
| 6,373,671 B1 * | 4/2002 | Watanabe et al. | 361/93.8 |

FOREIGN PATENT DOCUMENTS

| | | |
|---|---|---|
| JP | 01-103120 | 4/1989 |
| JP | 05-92824 | 12/1993 |
| JP | 08-065879 | 3/1996 |
| JP | 09-308239 | 11/1997 |
| JP | 2000-023346 | 1/2000 |
| JP | 2002-538751 | 11/2002 |

* cited by examiner

*Primary Examiner*—Michael J Sherry
*Assistant Examiner*—Lucy Thomas
(74) *Attorney, Agent, or Firm*—Fish & Richardson P.C.

(57) ABSTRACT

An overcurrent detection circuit that detects an overcurrent state of a transistor that outputs a current to a load is provided with a start-up monitoring portion that distinguishes between a start-up state and a steady state, an overcurrent monitoring portion that monitors an overcurrent state of the transistor, and an output voltage monitoring portion that detects whether the output voltage to the load is normal or abnormal. The overcurrent monitoring portion changes an overcurrent detection level while referring to information from the start-up monitoring portion and the overcurrent monitoring portion.

7 Claims, 4 Drawing Sheets

OVERCURRENT DETECTION CIRCUIT AND POWER SUPPLY APPARATUS PROVIDED THEREWITH

TECHNICAL FIELD

The present invention relates to an overcurrent detection circuit for use in a power supply apparatus or the like. More particularly, the present invention relates to an overcurrent detection circuit for use in a power supply apparatus or the like provided with a switching element that outputs a current to a load, and to a power supply apparatus provided with such an overcurrent detection circuit.

BACKGROUND ART

FIG. 4 is a diagram showing an electrical configuration of a power supply apparatus 100 provided with a conventional overcurrent detection circuit. The source electrode of a P-channel (P-type semiconductor) MOS transistor (insulated gate field-effect transistor) 101 is fed with an input voltage Va, and the drain electrode thereof is connected to the cathode of a diode 105 and to an input side of an overcurrent detection circuit 104 and, via an inductor 106, to one end of a capacitor 107 and to one end of a load 102. The anode of the diode 105, the other end of the capacitor 107, and the other end of the load 102 are grounded.

The overcurrent detection circuit 104 compares a voltage at the drain electrode of the MOS transistor 101 with a reference voltage thereof for monitoring whether or not the drain current of the MOS transistor 101 is an overcurrent (whether or not the drain current of the MOS transistor 101 is equal to or greater than an overcurrent detection level determined by the reference voltage), and gives the comparison result to a control portion 103. The control portion 103 monitors an output voltage VL to be applied to the load 102, and controls a voltage at the gate electrode of the MOS transistor 101 so that the output voltage VL is kept constant. The control portion 103 also receives an output of the overcurrent detection circuit 104, and thereby recognizes an overcurrent state of the MOS transistor 101. The input voltage Va is also fed to the control circuit 103 and the overcurrent detection circuit 104 as a power supply voltage thereof.

For protecting the power supply apparatus 100 from an overcurrent, there have been proposed three major methods (first to third methods, which will be described below). In the first method, once an overcurrent is detected, then the MOS transistor 101 is kept off. To cancel the off state, it is necessary to stop the supply of the input voltage Va and then restart the supply thereof.

However, the first method described above has the disadvantage that, if the overcurrent protection function operates as a result of a relatively high current (an inrush current) passing through the power supply apparatus 100 at start-up, the output voltage VL becomes 0 V, and therefore the power supply apparatus 100 fails to start (start-up failure occurs). Such start-up failure occurs notably in a case where the load 102 has a large input capacitance.

Assume that, to prevent such start-up failure, the overcurrent detection level set in the overcurrent detection circuit 104 is so set as to be greater than the maximum value of the inrush current. Then, even if a current nearly equal to the overcurrent detection level (ultimately, a current equal to the overcurrent detection level) continues to pass through the MOS transistor 101 due to variations in the load 102, for example, the MOS transistor 101 is kept on. This unfavorably leads to damage (damage by heat) not only of the MOS transistor 101 but also of the diode 105, the inductor 106, and the load 102, for example, and thus reduces the reliability of the power supply apparatus 100. On the other hand, to prevent damage to these components, as the power MOS transistor 101, the diode 105, the inductor 106 (in some cases, the load 102), or the like, those with larger rated currents have to be adopted. This leads to a larger mounting area, and also to a higher cost.

The second method is called a constant current drooping method, in which the drain current of the MOS transistor 101 is controlled so as not to exceed a certain level (i.e. the overcurrent detection level) irrespective of the value of the output voltage VL. In the second method, assume that the load 102 is short-circuited. Then, the drain current of the MOS transistor 101 is kept at the overcurrent detection level (or kept below the overcurrent detection level) without keeping the off state of the MOS transistor 101. Adopting the second method described above can prevent start-up failure as observed in the first method.

In the third method, an operation mode is switched according to a predetermined time as described in Patent Document 1 listed below. Disclosed is a power supply apparatus provided with an overcurrent protection function wherein, upon receiving from a switching control portion a power supply start signal from a remote ON/OFF terminal, a main switching portion starts to operate, a current of the main switching portion is detected, and, if an overcurrent is detected, an overcurrent protection circuit operates so as to control the switching control portion. This power supply apparatus is provided with a timer circuit that, upon receipt of the power supply start signal, transmits an "overcurrent protection set value at the time of overload" within a timer set time t1 and outputs to the overcurrent protection circuit a signal for switching to a rated output, a "steady overcurrent protection set value" after the timer set time t1 is elapsed (see, for example, Patent Document 1).

Patent Document 1: JP-A-08-065879

DISCLOSURE OF THE INVENTION

Problems to be Solved by the Invention

In general, in the above-described second method, the overcurrent detection level is so set as to be somewhat greater than or equal to the maximum value of the inrush current passing through the power supply apparatus at start-up. This helps realize quick start-up of the power supply apparatus without causing start-up failure as observed in the first method. However, the overcurrent detection level thus set is larger than is necessary for a steady state (a state in which the output voltage VL is stabilized at a certain target voltage). As a result, if the load 102 is, for example, short-circuited in the steady state, the drain current corresponding to the overcurrent detection level that is larger than is necessary continues to flow through the MOS transistor 101. As described earlier, this unfavorably leads to the reduction in reliability of the power supply apparatus, a larger mounting area, and also to a higher cost.

On the other hand, in the conventional configuration example described in Patent Document 1, a signal for switching to the rated output, the "steady overcurrent protection set value" is fed to the overcurrent protection circuit after the timer set time t1 is elapsed. That is, after the timer set time t1 is elapsed, the overcurrent protection set value is fixed at the "steady overcurrent protection set value".

However, a current required by the load varies, and it is common to connect a load such as a capacitive load that requires a high current (a charging current) for a short time (for example, for a few milliseconds) at times other than start-up, or a motor that extracts a surge of high current. In the conventional configuration example described in Patent Document 1, if such a high current flows therethrough at times other than start-up, the overcurrent protection function operates. This makes it impossible for the output voltage to reach a rated voltage (a target voltage) for a short time (for example, for a few milliseconds), or, depending on the characteristics of the protection function, the output voltage becomes 0 V.

If the output voltage fails to reach the rated voltage, even for a short time (for example, for a few milliseconds), the effect will be critically detrimental to the stable operation of the load including a microcomputer in particular. The above-described problem of the conventional configuration example described in Patent Document 1, that is, "the overcurrent protection function operates as a result of the passage of a high current at times other than start-up, making it impossible for the output voltage to reach the rated voltage, even for a short time", also arises when the conventional example shown in FIG. 4 adopts the above-described second method and sets the overcurrent detection level thereof at unduly small value.

In view of the conventionally experienced problems described above, it is an object of the present invention to provide an overcurrent detection circuit that can achieve optimum overcurrent protection depending on the state of a power supply apparatus or the like. It is another object of the present invention to provide a power supply apparatus provided with such an overcurrent detection circuit.

Means for Solving the Problem

To achieve the above object, according to one aspect of the present invention, an overcurrent detection circuit that detects an overcurrent state of a switching element that outputs a current to a load is provided with: a start-up monitoring portion that outputs a steady state signal when a time elapsed after the overcurrent detection circuit starts being fed with electric power exceeds a predetermined time, and that outputs a start-up state signal when the time elapsed after the overcurrent detection circuit starts being fed with electric power is less than the predetermined time; an overcurrent monitoring portion that can set two overcurrent detection levels, one of which is a first overcurrent detection level and the other of which is a second overcurrent detection level that is greater than the first overcurrent detection level, and that monitors the overcurrent state of the switching element; and an output voltage monitoring portion that detects whether an output voltage to the load is normal or abnormal by comparing a voltage commensurate with the output voltage with a predetermined voltage, and then gives the detection result to the overcurrent monitoring portion. Here, when the output voltage is abnormal and the steady state signal is outputted, the overcurrent monitoring portion sets the first overcurrent detection level as the overcurrent detection level, and, when the output voltage is normal or the start-up state signal is outputted, the overcurrent monitoring portion sets the second overcurrent detection level as the overcurrent detection level.

With this configuration, when the output voltage becomes abnormal due to a short-circuit of the load or the like, and the steady state signal is outputted (that is, the apparatus is not in the start-up state), the first overcurrent detection level having a relatively small value is set as the overcurrent detection level. As a result, the heat produced by, for example, the switching element and a component (such as a diode or an inductor; in FIG. 1, a diode 22 or an inductor 23) used for feeding a stabilized voltage to the load becomes relatively small, making it possible to enhance the reliability of a power supply apparatus provided with the overcurrent detection circuit described above.

Moreover, it becomes possible to adopt a component with smaller rated current as a switching element or a component used for feeding a stabilized voltage to the load. This helps achieve reduction in the mounting area, and also achieve cost reduction.

At start-up, since the start-up monitoring portion outputs a start-up state signal, the second overcurrent detection level having a relatively large value is set as the overcurrent detection level. Thus, by setting the second overcurrent detection level properly (for example, by setting the second overcurrent detection level so as to be somewhat greater than or nearly equal to the maximum value of the inrush current at start-up), it is possible to make the output voltage quickly reach a target voltage without suffering from start-up failure as observed in the conventional first method.

When the output voltage is normal (that is, the output voltage has risen above a certain voltage, and the load does not suffer from a short-circuit or the like), the second overcurrent detection level having a relatively large value is set as the overcurrent detection level. Thus, even when the load is, for example, a capacitive load that requires a high charging current for a short time (for example, for a few milliseconds) at times other than start-up, or a motor that extracts a surge of high current, the overcurrent protection operation dose not operate. This eliminates the possibility of the output voltage not reaching the rated voltage temporarily (for example, for a few milliseconds).

To ensure the reliability of the power supply apparatus provided with the overcurrent detection circuit described above, it is required, for example, that the switching element or the like is prevented from being damaged even if the load is short-circuited for a longer period of time (for example, for one minute). Thus, the first overcurrent detection level is so set, for example, as to satisfy the above-described requirement. That is, even when a current corresponding to the first overcurrent detection level flows through the switching element for a longer period of time (for example, for one minute), the switching element or the like is prevented from being damaged (from being damaged by heat).

Thus, even when a current at the second overcurrent detection level that is greater than the first overcurrent detection level flows through the capacitive load or the like when the output voltage is normal (that is, the output voltage has risen above a certain voltage, and the load does not suffer from a short-circuit or the like), the switching element or the like is prevented from being damaged (from being damaged by heat) so long as the period in which the current at the second overcurrent detection level flows lasts for a short duration (for example, equal to or less than a few milliseconds). This makes it possible to maintain the high reliability of the power supply apparatus.

For example, in the configuration described above, the output voltage monitoring portion may compare the magnitude of the voltage commensurate with the output voltage with the magnitude of a predetermined detection voltage. When the magnitude of the voltage commensurate with the output voltage is greater than the magnitude of the detection voltage, the output voltage monitoring portion detects that the output voltage is normal, and, when the magnitude of the voltage commensurate with the output voltage is smaller than the magnitude of the detection voltage, the output voltage monitoring portion detects that the output voltage is abnormal, and then gives the detection result to the overcurrent monitoring portion.

For example, in the configuration described above, the start-up monitoring portion may include a soft-start circuit that controls, while outputting a voltage commensurate with the time elapsed after the overcurrent detection circuit starts being fed with electric power, the switching element in such a way that a soft-start operation is performed so that the output voltage rises gently when the overcurrent detection circuit starts being fed with electric power. Based on the voltage outputted from the soft-start circuit, the start-up monitoring portion may output the steady state signal or the start-up state signal.

Commonly-used power supply apparatuses have a soft-start circuit. Thus, the configuration described above eliminates the need to provide an extra timer circuit or the like for the start-up monitoring portion. This helps simplify the circuitry, achieve reduction in the mounting area, and also achieve cost reduction as compared with the configuration described in Patent Document 1.

For example, in the configuration described above, based on a voltage generated by a passage of a predetermined current through a capacitive element after the overcurrent detection circuit starts being fed with electric power, the start-up monitoring portion may output the steady state signal or the start-up state signal.

The soft-start circuit or the like provided in the commonly-used power supply apparatuses can output the "voltage generated by a passage of a predetermined current through a capacitive element after the overcurrent detection circuit starts being fed with electric power". Thus, there is no need to provide an extra timer circuit or the like for the start-up monitoring portion. This helps simplify the circuitry, achieve reduction in the mounting area, and also achieve cost reduction as compared with the configuration described in Patent Document 1.

For example, in the configuration described above, the first overcurrent detection level, and the second overcurrent detection level are determined on the basis of an input voltage to the switching element.

For example, in the configuration described above, the overcurrent detection circuit may be further provided with a control portion that controls the switching element according to a signal relating to the overcurrent state of the switching element, the signal being outputted from the overcurrent monitoring portion.

According to another aspect of the present invention, a power supply apparatus is provided with an overcurrent detection circuit configured as described above, the switching element, and a smoothing circuit that smoothes a voltage at an output side of the switching element, and then outputs the smoothed voltage to the load.

Since the power supply apparatus is provided with the overcurrent detection circuit configured as described above, the reliability of the power supply apparatus is enhanced as described above. Moreover, it becomes possible to adopt a component with smaller rated current as the switching element or a component forming the smoothing circuit. This helps achieve reduction in the mounting area, and also achieve cost reduction.

Effect of the Invention

As described above, according to the overcurrent detection circuit of the present invention, it is possible to achieve optimum overcurrent protection depending on the state of a power supply apparatus or the like. This makes it possible to enhance the reliability of the power supply apparatus or the like, and achieve reduction in the mounting area thereof as well as in the cost thereof.

Figure 1:
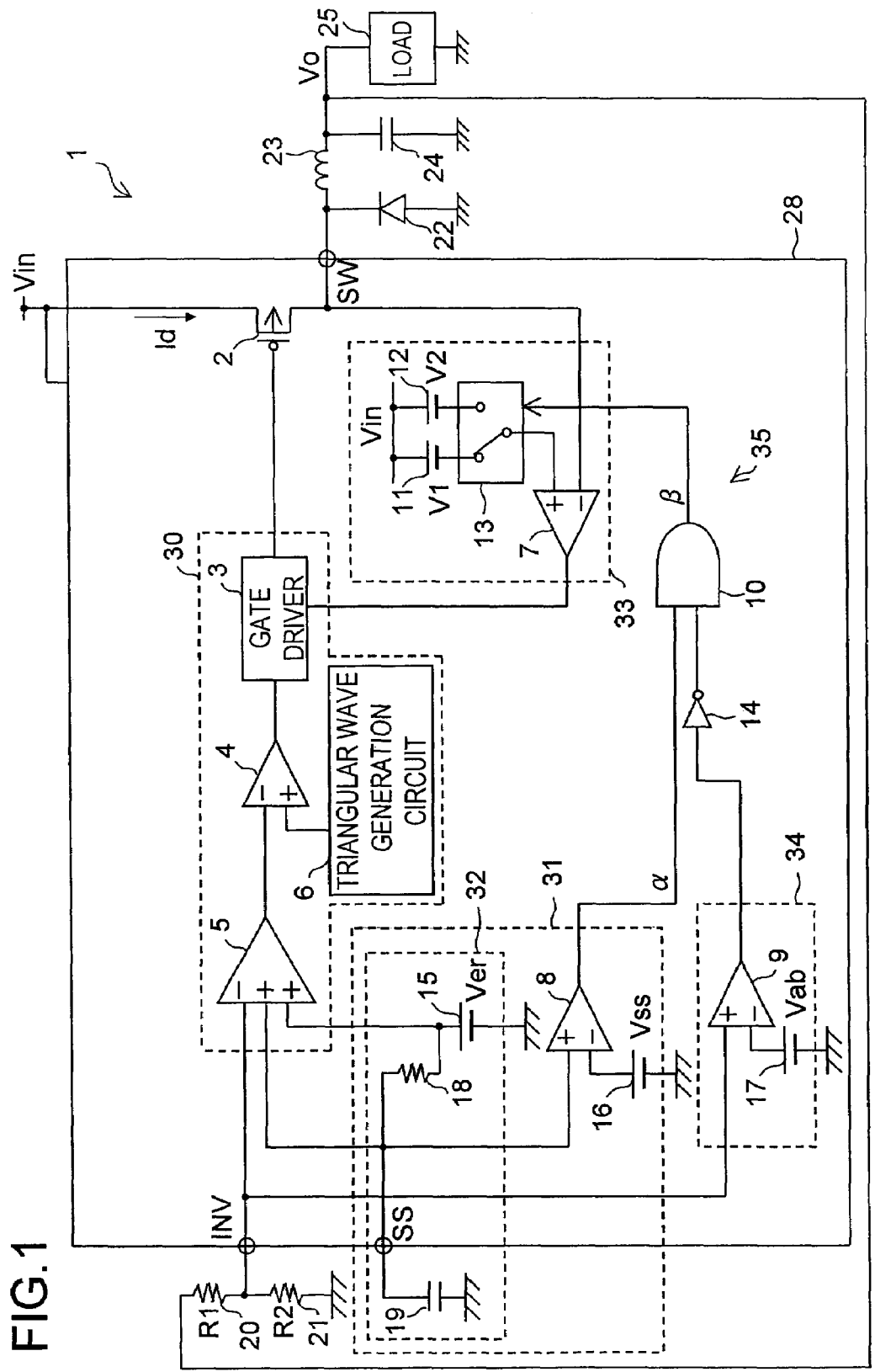
[FIG. 1] A circuit diagram of the overcurrent detection circuit of a first embodiment of the present invention and the power supply apparatus provided with such an overcurrent detection circuit.

LIST OF REFERENCE SYMBOLS 1, 51, 100 power supply apparatus
2, 52, 101 MOS transistor
3 gate driver
4 PWM comparator
5 error amplifier
6 triangular wave generation circuit
7, 8, 9 comparator
10 AND circuit
11, 12, 15, 16, 17 voltage source
13 switch circuit
14 inverter
18, 20, 21, 53 resistor
19, 24, 107 capacitor
22, 105 diode
23, 106 inductor
25, 102 load
28, 58 integrated circuit element
30, 103 control portion
31, 37 start-up monitoring portion
32, 36 soft-start circuit
33 overcurrent monitoring portion
34 output voltage monitoring portion
35, 38, 104 overcurrent detection circuit
60 constant-current source
Vin, Va input voltage
Vo, VL output voltage
SS, INV, SW terminal

BEST MODE FOR CARRYING OUT THE INVENTION

First Embodiment

Hereinafter, a first embodiment of the overcurrent detection circuit of the present invention and the power supply apparatus provided with such an overcurrent detection circuit will be described. FIG. 1 is a diagram showing the circuit configuration of a power supply apparatus 1 of the first embodiment.

(FIG. 1: Description of the Configuration)

The source electrode of a P-channel MOS transistor 2 serving as a switching element is fed with an input voltage Vin fed from the outside, and the drain electrode thereof is connected to the inverting input terminal (−) of a comparator 7, to the cathode of a diode 22, and to one end of an inductor 23. The other end of the inductor 23 is grounded via a circuit in which a capacitor 24 for smoothing an output voltage Vo to be applied to a load 25 and the load 25 are connected in parallel. The anode of the diode 22 is grounded. As described above, the drain electrode of the MOS transistor 2 is made to output a current (feed electric power) to the load 25, and the diode 22, the inductor 23, and the capacitor 24 form a smoothing circuit that smoothes a voltage at the output side (a voltage at the drain electrode) of the MOS transistor 2 and then outputs the resultant voltage to the load 25.

The output voltage Vo is grounded via a circuit in which resistors 20 and 21 are connected in series, and a node at which the resistors 20 and 21 are connected together is connected to the inverting input terminal (−) of an error amplifier 5 and to the non-inverting input terminal (+) of a comparator 9 that monitors whether the output voltage Vo is normal or abnormal. Voltage sources 15, 16, and 17 generate an error reference voltage Ver, an SS (soft-start) detection voltage Vss, and a detection voltage Vab, respectively. The voltages generated by the voltage sources 15, 16, and 17 are fed to a second non-inverting input terminal (+) of the error amplifier 5, to the inverting input terminal (−) of the comparator 8, and to the inverting input terminal (−) of the comparator 9, respectively, based on the GND (ground). It is to be noted that Ver>Vss.

The second non-inverting input terminal (+) of the error amplifier 5 is connected via a resistor 18 to a first non-inverting input terminal (+) thereof, to the non-inverting input terminal (+) of the comparator 8, and to one end of a capacitor 19. The other end of the capacitor 19 is grounded.

The inverting input terminal (−) and the non-inverting input terminal (+) of a PWM comparator 4 are respectively fed with an output voltage of the error amplifier 5 and a triangular voltage outputted from a triangular wave generation circuit 6. The PWM comparator 4 outputs to a gate driver 3 a pulse-width modulated control signal for the MOS transistor 2.

The output (α) of the comparator 8 is fed to one input terminal of an AND circuit 10. The output of the comparator 9 is inverted by an inverter 14, and is then fed to the other input terminal of the AND circuit 10. The output (β) of the AND circuit is fed to a switch circuit 13 as a control voltage for controlling the switch circuit.

A voltage source 11 outputs a voltage V1 corresponding to a first overcurrent detection level of the present invention, and a voltage source 12 outputs a voltage V2 corresponding to a second overcurrent detection level of the present invention. The voltage sources 11 and 12 are each fed with the input voltage Vin at one end thereof and connected at the other end thereof to a corresponding one of first and second fixed terminals of the switch circuit 13. It is to be noted that V1<V2 (that is, the second overcurrent detection level is greater than the first overcurrent detection level). The common terminal of the switch circuit 13 is connected to the non-inverting input terminal (+) of the comparator 7, and the output of the comparator 7 is fed to the gate driver 3 as a voltage indicating an overcurrent state of the MOS transistor 2. It should be understood that, in the present specification, the "overcurrent state" is a state in which the drain current of the MOS transistor 2 becomes equal to or greater than a previously determined overcurrent detection level (the first overcurrent detection level or the second overcurrent detection level) and the potential of the output of the comparator 7 becomes high (at a high level).

The output side of the gate driver 3 is connected to the gate electrode of the MOS transistor 2. The gate driver 3 controls on/off of the MOS transistor 2 according to the control signal outputted from the PWM comparator 4 while referring to the voltage outputted from the comparator 7 (the voltage indicating the overcurrent state of the MOS transistor 2).

The MOS transistor 2, the gate driver 3, the PWM comparator 4, the error amplifier 5, the triangular wave generation circuit 6, the comparators 7, 8, and 9, the AND circuit 10, the voltage sources 11 and 12, the switch circuit 13, the inverter 14, the voltage sources 15, 16, and 17, and the resistor 18 are housed together in a single package, forming an integrated circuit element 28. All the components included in the integrated circuit element 28, such as the gate driver 3, operate on the input voltage Vin. Terminals SS, INV, and SW of the integrated circuit element 28 are connected to the non-inverting input terminal (+) of the comparator 8, to the inverting input terminal (−) of the error amplifier 5, and to the drain electrode of the MOS transistor, respectively.

It is to be noted that the components are divided into those provided inside the integrated circuit element 28 and those provided outside the integrated circuit element 28 for illustration purpose only. For example, the MOS transistor 2 may be provided outside the integrated circuit element 28, so that a voltage other than the input voltage Vin is fed to the integrated circuit element 28 as a power supply voltage. Alternatively, the comparator 9, instead of being provided inside the integrated circuit element 28, may be connected to the outside of the integrated circuit element 28, or the capacitor 19 may be provided inside the integrated circuit element 28. It is to be noted that FIG. 1 illustrates a state in which the common terminal of the switch circuit 13 is connected to the first fixed terminal (the terminal located on the voltage source 11 side).

(FIG. 1: Description of an Operation)

The error amplifier 5 is so configured that, under the condition (hereinafter the "condition 1") that a voltage applied to the inverting input terminal (−) thereof is lower than both a voltage applied to the first non-inverting input terminal (+) thereof and a voltage applied to the second non-inverting input terminal (+) thereof, the error amplifier 5 outputs a higher voltage than when the condition 1 is not fulfilled. The driver 3 or the like is so configured that, under the condition 1, the MOS transistor 2 is kept on for longer than when the condition 1 is not fulfilled.

A voltage obtained by dividing the output voltage Vo by the resistors 20 and 21 is compared with the error reference voltage Ver and a voltage applied to the terminal SS. The MOS transistor 2 is so controlled as to make these three voltages equal to each other in a steady state (a state in which the output voltage Vo is stabilized at a target voltage Vtar). That is, the target voltage Vtar at which the output voltage Vo should be stabilized is determined by the error reference voltage Ver and a voltage division ratio of the resistors 21 and 22, and the output voltage Vo is stabilized at the target voltage Vtar through the action of a control portion 30 mainly built with the error amplifier 5, the PWM comparator 4, the triangular wave generation circuit 6, and the gate driver 3. In other words, the control portion 30 controls on/off of the MOS transistor 2 in such a way that the output voltage Vo is maintained (stabilized) at the target voltage Vtar.

An overcurrent monitoring portion 33 is mainly built with the voltage sources 11 and 12, the switch circuit 13, and the comparator 7, and monitors the MOS transistor 2 for an overcurrent state. As mentioned earlier, the overcurrent monitoring portion 33 can set two overcurrent detection levels, one of which is the first overcurrent detection level and the other of which is the second overcurrent detection level that is greater than the first overcurrent detection level.

An output voltage monitoring portion 34 is mainly built with the comparator 9 and the voltage source 17. Assume that the resistance values of the resistors 20 and 21 are R1 and R2, respectively. Then, the output voltage monitoring portion 34 compares, with the detection voltage Vab, a voltage (=Vo·R2/(R1+R2); a voltage commensurate with the output voltage Vo) obtained by dividing the output voltage Vo by the resistors 20 and 21. If it is found that Vo·R2/(R1+R2)>Vab, the output voltage monitoring portion 34 detects that the output voltage Vo is normal. On the other hand, if it is found that Vo·R2/(R1+R2)<Vab, the output voltage monitoring portion 34 detects that the output voltage Vo is abnormal. In other words, by comparing the output voltage, Vo with a voltage (Vab·(R1+R2)/R2), the output voltage monitoring portion 34 detects whether the output voltage Vo is normal or abnormal. The detection result thus obtained is fed to the overcurrent monitoring portion 33 via the inverter 14 and the AND circuit 10.

Here, a case is taken as an example in which the output voltage Vo of the power supply apparatus 1 is positive. Obviously, the power supply apparatus 1 may be modified so as to output a negative output voltage Vo. With consideration given to this fact, the output voltage monitoring portion 34 compares the absolute value (magnitude) of a voltage (=Vo·R2/(R1+R2); a voltage commensurate with the output voltage Vo) obtained by dividing the output voltage Vo by the resistors 20 and 21 with the absolute value (magnitude) of the detection voltage Vab. If it is found that |Vo·R2/(R1+R2)|>|Vab|, the output voltage monitoring portion 34 detects that the output voltage Vo is normal. On the other hand, if it is found that |Vo·R2/(R1+R2)|<|Vab|, the output voltage monitoring portion 34 detects that the output voltage Vo is abnormal.

Incidentally, the inverter 14 can be viewed as a part of the output voltage monitoring portion 34 or the overcurrent monitoring portion 33 described above, and the AND circuit 10 can be viewed as a part of the overcurrent monitoring portion 33.

A soft-start circuit 32 is mainly built with the voltage source 15, the resistor 18, and the capacitor 19. The soft-start circuit 32 controls the MOS transistor 2 in such a way that a soft-start operation is performed (the output voltage Vo rises gradually) at power-on (at the start of application of the input voltage Vin). Without the soft-start circuit 32 (that is, if the resistor 18 is 0 ohm), a high inrush current flows through the load 25 or the like at power-on, causing the output voltage Vo to rise sharply. By contrast, thanks to the function of the soft-start circuit 32 and the error amplifier 5, the inrush current to the load 25 or the like at power-on is made comparatively smaller (than when there is no soft-start circuit 32), and the output voltage Vo rises more gently (gradually) than when there is no soft-start circuit 32. That is, "the soft-start operation is performed so that the output voltage Vo rises gently at power-on" means that the output voltage Vo rises more gently at power-on than when there is no soft-start circuit 32. This makes it possible to make smaller the rated value of an input current of the inductor 23, the capacitor 24, or the load 25. Moreover, the soft-start circuit 32 helps reduce the overshoot of the output voltage Vo resulting from, for example, delay in response of the error amplifier 5.

A start-up monitoring portion 31 is mainly built with the soft-start circuit 32, the comparator 8, and the voltage source 16.

An overcurrent detection circuit 35 is mainly built with the start-up monitoring portion 31, the overcurrent monitoring portion 33, and the output voltage monitoring portion 34. The overcurrent detection circuit 35 detects an overcurrent state of the MOS transistor 2. Incidentally, the control portion 30 may be viewed as a part of the overcurrent detection circuit 35. The overcurrent detection circuit 35 operates on the input voltage Vin.

After the overcurrent detection circuit 35 starts being fed with electric power, the potential at the node at which the soft-start circuit 32 is connected to the terminal SS starts to rise. The voltage applied to the terminal SS corresponds to the time elapsed after the power-on, and the rate of rise of the voltage is determined by the error reference voltage Ver, the resistance value of the resistor 18, and the capacitance of the capacitor 19. In other words, the voltage applied to the terminal SS is generated by the passage of a current determined by the error reference voltage Ver, the resistance value of the resistor 18, and the capacitance of the capacitor 19 through the capacitor 19, which is a capacitive element, after the power-on.

Then, the comparator 8 outputs the comparison result obtained by comparing the voltage applied to the terminal SS with the SS detection voltage Vss. That is, when the time elapsed after the overcurrent detection circuit 35 starts being fed with electric power exceeds the time determined by the SS detection voltage Vss, the start-up monitoring portion 31 causes the comparator 8 to output a high-potential (high) voltage (corresponding to a "steady state signal" in the present invention). On the other hand, when the time elapsed after the overcurrent detection circuit 35 starts being fed with electric power is equal to or less than (or simply less than) the time determined by the SS detection voltage Vss, the start-up monitoring portion 31 causes the comparator 8 to output a low-potential (low) voltage (corresponding to a "start-up state signal" in the present invention).

The voltage applied to the terminal SS can be viewed as a voltage outputted from the soft-start circuit 32. Thus, it can be said that the start-up monitoring portion 31 detects the time elapsed after the overcurrent detection circuit 35 starts being fed with electric power based on the voltage outputted from the soft-start circuit 32 (the voltage applied to the terminal SS), and, according to the time thus detected, outputs the "steady state signal" or the "start-up state signal". Based on the voltage outputted from the soft-start circuit 32, the error amplifier 5 controls the output voltage Vo at power-on.

The inverting input terminal of the comparator 7 is fed with a voltage (Vin−Ron·Id) obtained by subtracting the product of the on-resistance value Ron of the MOS transistor 2 and the drain current Id thereof from the input voltage Vin. The switch circuit 13 is so configured that, when the output of the AND circuit 10 takes a high level, (Vin−V2) is applied to the non-inverting input terminal (+) of the comparator 7, and, when the output of the AND circuit 10 takes a low level, (Vin−V1) is applied thereto.

When the output of the AND circuit 10 takes a high level, that is, when the output voltage Vo is found to be abnormal (when the relationship |Vo·R2/(R1+R2)|<|Vab|holds) and the comparator 8 (the start-up monitoring portion 31) outputs a "steady state signal" (a high output signal), the overcurrent monitoring portion 33 sets a first overcurrent detection level ($I_{Lim1}$) as an overcurrent detection level thereof. That is, the overcurrent monitoring portion 33 compares the voltage (Ron·Id) with the voltage V1, and gives the comparison result thus obtained to the gate driver 3. Here, the first overcurrent detection level ($I_{Lim1}$) is equal to V1/Ron.

When the relationship Ron·Id <V1 holds, the comparator 7 gives a low-level signal to the gate driver 3. In response to this, the gate driver 3, judging that the MOS transistor 2 is not in the overcurrent state, performs a normal control (by which the output voltage Vo is maintained at the target voltage Vtar).

On the other hand, when the relationship Ron·Id>V1 (or Ron·Id≧V1) holds (when the overcurrent state is detected), the comparator 7 gives a high-level signal to the gate driver 3. In response to this, the gate driver 3, judging that the overcurrent state is: detected by the overcurrent detection circuit 35, turns the MOS transistor 2 off. As a result, the relationship Ron·Id>V1 (or Ron·Id≧V1) does not hold temporarily. However, thanks to the function of the control portion 30, the MOS transistor 2 is turned on again. When the relationship Ron·Id>V1 (or Ron·Id>V1) holds again, the MOS transistor 2 is turned off again.

As described above, the control portion 30 including the gate driver 3 controls the MOS transistor 2 in such a way that the drain current Id of the MOS transistor 2 becomes equal to or smaller than a current value (V1/Ron) determined by the overcurrent detection level. This control method is a constant current drooping method, by which the drain current is controlled so as to be equal to or smaller than a certain value irrespective of the value of the output voltage Vo.

On the other hand, when the output of the AND circuit 10 takes a low level, that is, when the output voltage Vo is found to be normal (when the relationship |Vo·R2/(R1+R2)|>|Vab|holds), or the comparator 8 (the start-up monitoring portion 31) outputs a "start-up state signal" (a low output signal), the overcurrent monitoring portion 33 sets a second overcurrent detection level ($I_{Lim2}$) as an overcurrent detection level thereof. That is, the overcurrent monitoring portion 33 compares the voltage (Ron·Id) with the voltage V2, and gives the comparison result thus obtained to the gate driver 3. Here, the second overcurrent detection level ($I_{Lim2}$) is equal to V2/Ron.

When the relationship Ron·Id<V2 holds, the comparator 7 gives a low-level signal to the gate driver 3, and, when the relationship Ron·Id>V2 (or Ron·Id≧V2) holds (when the overcurrent state is detected), the comparator 7 gives a high-level signal to the gate driver 3. According to the output of the comparator 7, the control portion 30 including the gate driver 3 operates in the same manner as when the output of the AND circuit 10 takes a high level.

Assume that a drain current Of $I_{Lim1}$·1/100 is made to pass through a detector MOS transistor (not shown) having, for example, 100 times the on-resistance value Ron of the MOS transistor 2. Then, a voltage of Ron·$I_{Lim1}$(=100Ron·$I_{Lim1}$·1/100) is generated between the drain and source of the detector MOS transistor. The voltage source 11 may be configured so as to have the voltage of Ron·$I_{Lim1}$ as an output voltage V1 thereof.

For example, assume that the MOS transistor 2 is built as a single MOS transistor in which 100 unit cell transistors are arranged in such a way that the drains, sources, and gates thereof are connected in parallel, and a detector MOS transistor (not shown) is built with a single unit cell transistor. Then, the on-resistance value of the detector MOS transistor is about 100·Ron. It should be understood that the unit cell transistors constituting the MOS transistor 2 and the unit cell transistor constituting the detector MOS transistor (not shown) are formed on the identical semiconductor substrates by the same fabrication process. Note that the voltage source 12 is configured in the same manner as the voltage source 11.

Figure 2:
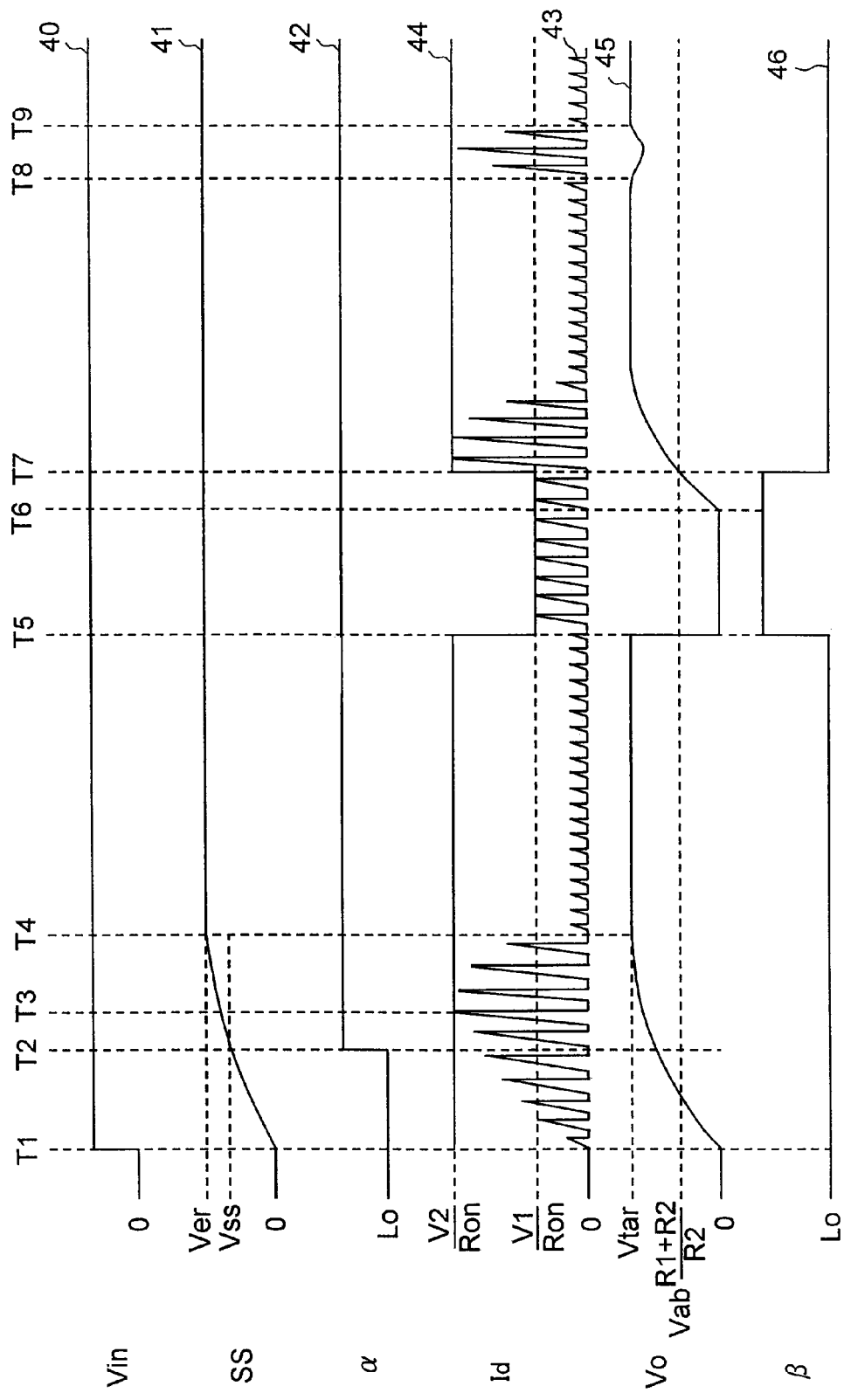
[FIG. 2] A diagram showing the waveforms of relevant voltages and current observed in the power supply apparatus shown in FIG. 1.

(FIG. 2: Description Using Waveforms)

Next, how the overcurrent detection circuit 35 and the power supply apparatus 1 operate will be described with reference to FIG. 2 showing the waveforms of relevant voltages and current observed in the power supply apparatus 1.

In FIG. 2, solid lines 40, 41, 42, 43, 44, 45, and 46 respectively indicate a waveform of the input voltage Vin, a waveform of a voltage applied to the terminal SS, a voltage waveform of the output (α; see FIG. 1) of the comparator 8, a waveform of a drain current (Id) of the MOS transistor 2, an overcurrent detection level, a waveform of the output voltage Vo, and a voltage waveform of the output (β; see FIG. 1) of the AND circuit 10.

First, at time T1, the input voltage Vin starts being applied. Then, the capacitor 19 starts being charged, and the voltage applied to the terminal SS starts to rise. Since the output voltage Vo is 0 V immediately after power-on, the control portion 30 controls the MOS transistor 2 so that the output voltage Vo rises up to the target voltage Vtar. As a result of the control performed for the MOS transistor 2, the drain current Id passes therethrough. At this time, however, thanks to the function of the soft-start circuit 32, the drain current Id increases relatively gently, and the output voltage Vo also rises relatively gently (see the period from time T1 to time T3). As a result of the operation of the soft-start circuit 32, the voltage applied to the terminal SS rises roughly in synchronism with the output voltage Vo.

Since the output (α) of the comparator 8 takes a low level (Lo), the output (β) of the AND circuit 10 also takes a low level. As a result, the overcurrent detection level is a second overcurrent detection level (V2/Ron).

At time T2, the voltage applied to the terminal SS reaches the SS detection voltage Vss, and the output (α) of the comparator 8 is switched from a low level to a high level. It is to be noted that the relevant parts of the power supply apparatus 1 are configured so that at time T2 the output voltage Vo greatly exceeds a threshold value, Vab (R1+R2)/R2, which is a threshold between normal/abnormal conditions. Thus, at time T2, the output (β) of the AND circuit 10 takes a low level.

At time T3, the drain current Id reaches the second overcurrent detection level. At this point, the MOS transistor 2 is turned off via the gate driver 3, and therefore the drain current Id does not exceed the second overcurrent detection level. In general, the second overcurrent detection level is so set as to be somewhat greater than or nearly equal to the maximum value of the inrush current flowing through the power supply apparatus 1 at start-up thereof (at the time the output voltage Vo increases from 0 V toward the target voltage Vtar for the first time after application of the input voltage Vin). This makes the output voltage Vo quickly reach the target voltage Vtar. In FIG. 2, the maximum value of the inrush current reaches the second overcurrent detection level for explanation of the overcurrent protection operation.

At start-up, the inrush current flows through the load 25 only for short time (for example, for several tens of microseconds or more but a few milliseconds or less). As a result, even when the second overcurrent detection level having a relatively larger value is set as the overcurrent detection level, the MOS transistor 2, the diode 22, the inductor 23, or the like produce little heat (at the same time, the integrated circuit element 28 as a whole produces little heat). This helps prevent these components from being damaged (from being damaged by heat) and thereby ensure high reliability of the power supply apparatus 1.

At time T4, the output voltage Vo reaches the target voltage Vtar. Between time T4 and time T5, the output voltage Vo is stabilized at the target voltage Vtar and is in the steady state, and therefore the inrush current as observed at start-up does not flow. As a result, the drain current Id takes a relatively small value.

At time T5, assume that the load 25 is short-circuited. Then, the output voltage Vo drops to 0 V, which is smaller than Vab (R1+R2)/R2. At this point, the output of the comparator 9 takes a low level, and therefore the output (β) of the AND circuit 10 takes a high level. As a result, the overcurrent detection level is switched to a first overcurrent detection level (V1/Ron).

Then, although the output voltage Vo is 0 V, the maximum value of the drain current Id is limited to the first overcurrent detection level that is smaller than the second overcurrent detection level (see the period between time T5 and time T6). By setting a value as a first overcurrent detection level that prevents the MOS transistor 2, the diode 22, the inductor 23, or the like from being damaged even if the period between time T5 and time T6 lasts for a long duration (for example, for one minute), it is possible to make the power supply apparatus 1 highly reliable.

Moreover, by setting the first overcurrent detection level properly, it is possible to adopt a component with smaller rated current as the MOS transistor 2, the diode 22, the inductor 23, or the like while maintaining the reliability of the power supply apparatus 1. This helps achieve reduction in the mounting area, and also achieve cost reduction.

At time T6, the load 25 is recovered from a short-circuit, and the output voltage Vo starts to rise again.

Then, at time T7, the output voltage Vo reaches Vab (R1+R2)/R2, the output (β) of the AND circuit 10 is switched to a low level, and the overcurrent detection level is switched to the second overcurrent detection level. Thereafter, between time T7 and time T8, the output voltage Vo reaches the target voltage Vtar again.

Note that, after time T6, the output voltage Vo does not undergo the soft-start operation in the process of increasing to the target voltage Vtar. To make the output voltage Vo undergo the soft-start operation, it is necessary simply to modify the circuitry shown in FIG. 1 as described under (1) and (2) below.

(1) As observed in time T5, in the state where the output voltage Vo is 0 V, the voltage applied to the SS terminal is made to temporarily drop to 0 V.

(2) A latch circuit (not shown) that makes the AND circuit 10 always receive a high-level signal at one input terminal thereof (an input terminal to which the output of the inverter 14 is not connected) once the output of the comparator 8 takes a high level after the power-on is inserted in a line extending from the output of the comparator 8 to the one input terminal of the AND circuit 10.

Next, assume that the current required by the load 25 increases at time T8, and the output voltage Vo temporarily drops to below the target voltage Vtar (but remains equal to or greater than Vab (R1+R2)/R2). Then, the control portion 30 tries to make the output voltage Vo equal to the target voltage Vtar by increasing the drain current Id to a value greater than the first overcurrent detection level (in the period between time T8 and time T9). At this time, since the second overcurrent detection level is set as the overcurrent detection level, the overcurrent protection function does not operate, and therefore the output voltage Vo quickly recovers to the target voltage Vtar.

Even when the current consumed by the load 25, when averaged over a sufficiently long time, appears to be stable, the current required by the load 25 usually vary greatly over a shorter amount of time (for example, a few milliseconds) even at times other than start-up. Such variations become more pronounced in a case where the load 25 is, for example, a capacitive load that requires a high charging current for a short time (for example, for a few milliseconds) at times other than start-up, or a motor that extracts a surge of high current. However, since the second overcurrent detection level having a relatively larger value is set as the overcurrent detection level, the overcurrent protection operation does not operate even when such variations occur, and the output voltage Vo is always maintained at the target voltage Vtar (strictly speaking, the output voltage Vo quickly recovers to the target voltage Vtar).

Second Embodiment

Figure 3:
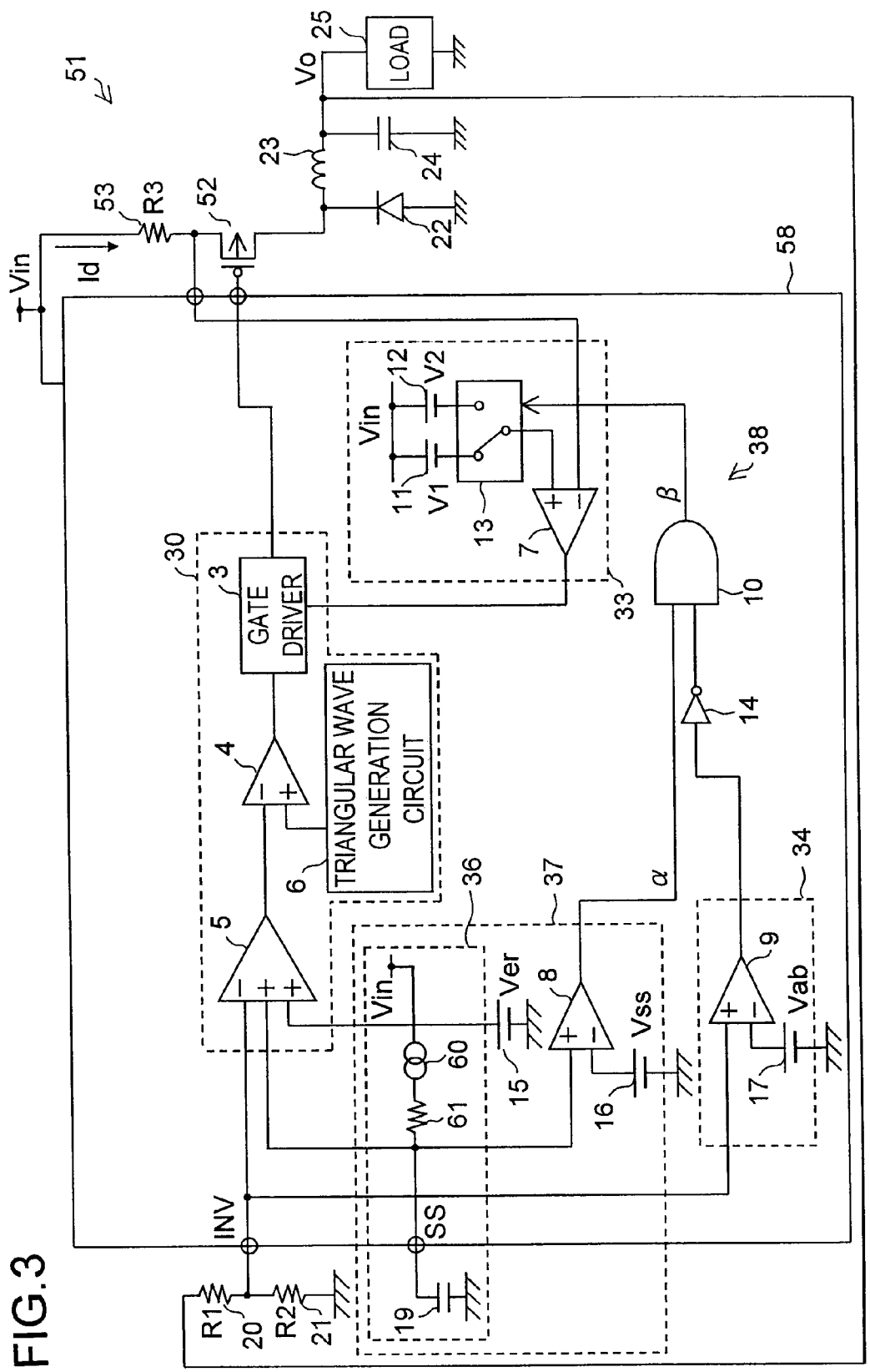
[FIG. 3] A circuit diagram of the overcurrent detection circuit of a second embodiment of the present invention and the power supply apparatus provided with such an overcurrent detection circuit.
Figure 4:
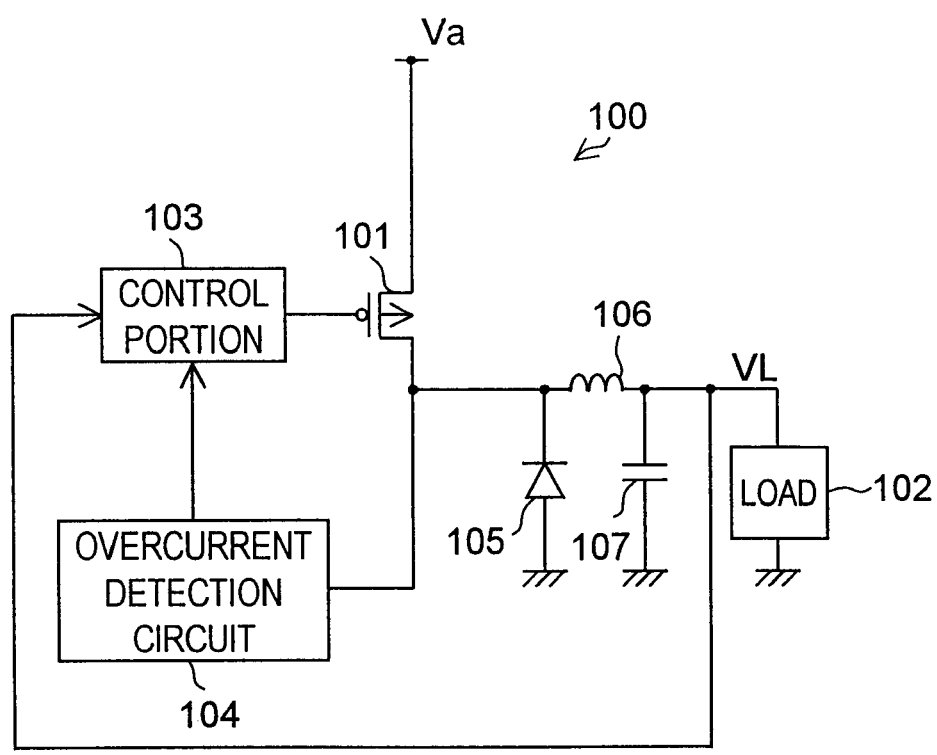
[FIG. 4] A circuit diagram of a power supply circuit provided with a conventional overcurrent detection circuit.

Next, a second embodiment of the overcurrent detection circuit of the present invention and the power supply apparatus provided with such an overcurrent detection circuit will be described. FIG. 3 is a diagram showing the circuit configuration of a power supply apparatus 51 of the second embodiment. In FIG. 3, such components as are found also in FIG. 1 will be identified with common reference characters and their detailed descriptions will be omitted.

The power supply apparatus 51 differs from a power supply apparatus 1 in the following respects. The power supply apparatus 51 is provided with, instead of an integrated circuit element 28, an integrated circuit element 58, which does not have a switching element corresponding to a MOS transistor 2. As a switching element corresponding to the MOS transistor 2, a P-channel MOS transistor 52 is provided outside the integrated circuit element 58. The output of a gate driver 3 is fed to the gate electrode of the MOS transistor 52, and the gate driver 3 performs on/off control of the MOS transistor 52.

An input voltage Vin is fed to the source electrode of the MOS transistor 52 via a resistor 53 having a resistance value of R3, and the drain electrode of the MOS transistor 52 is connected to the cathode of a diode 22 and to one end of an inductor 23. A node at which the resistor 53 and the source electrode of the MOS transistor 52 are connected together is connected to the inverting input terminal (−) of a comparator 7.

Moreover, instead of a soft-start circuit 32 provided in the power supply apparatus 1, a soft-start circuit 36 is provided. The soft-start circuit 36 is mainly built with a constant-current source 60, a resistor 61, and a capacitor 19. A voltage Vin is fed to one end of the constant-current source 60, and the other end of the constant-current source 60 is connected, via the resistor 61, to a first non-inverting input terminal (+) of an error amplifier 5, to the non-inverting input terminal (+) of a comparator 8, and to a terminal SS. As is the case with the power supply apparatus 1, the terminal SS is grounded via the capacitor 19. Note that a resistor 18 provided in the power supply apparatus 1 is not provided in the power supply apparatus 51.

At power-on, the capacitor 19 is charged with a constant current outputted from the constant-current source 60. The soft-start circuit 36, having the same function as the soft-start circuit 32 of the power supply apparatus 1, controls the MOS transistor 52 in such a way that a soft-start operation is performed (the output voltage Vo rises gradually) at power-on (at the start of application of the input voltage Vin).

A start-up monitoring portion 37 is mainly built with the soft-start circuit 36, the comparator 8, and a voltage source 16, and operates in the same manner as a start-up monitoring portion 39 provided in the power supply apparatus 1. An overcurrent detection circuit 38 is mainly built with the start-up monitoring portion 37, an overcurrent monitoring portion 33, and an output voltage monitoring portion 34, and detects an overcurrent state of the MOS transistor 52. Incidentally, the control portion 30 may be viewed as a part of the overcurrent detection circuit 38. The overcurrent detection circuit 38 operates on the input voltage Vin.

With the configuration described above, a voltage (R3·Id), which is the product of a drain current Id of the MOS transistor 52 and the resistance value R3 of the resistor 53, is compared with a voltage V1 or a voltage V2. That is, a voltage (in the overcurrent detection circuit 35 of the first embodiment, a voltage (Ron·Id)) to be compared with the voltage V1 or the voltage V2 by the comparator 7 is only replaced by the voltage (R3·Id).

Thus, with the power supply apparatus 51 configured as described above, it is possible to achieve the same operation as that of the power supply apparatus 1, and thereby obtain various benefits as obtained by the power supply apparatus 1 such as enhanced reliability. Moreover, with the power supply apparatus 51 configured as described above, it is possible to detect an overcurrent accurately irrespective of the on-resistance value of the MOS transistor 52 (because the overcurrent detection is performed based on the product of the resistance value R3 and the drain current Id). This makes it possible to adopt, instead of a MOS transistor, a junction field-effect transistor or a bipolar transistor as a switching element.

Alternatively, both or one of the voltage sources 11 and 12 may be provided outside the integrated circuit element 58, so that the overcurrent detection level is freely set according to purpose of use.

MODIFIED EXAMPLES

In the power supply apparatus 1 and the power supply apparatus 51, a voltage at a node at which the resistor 20 and the resistor 21 are connected together is applied to the non-inverting input terminal (+) of the comparator 9. It is to be understood, however, that the circuit configurations shown in FIGS. 1 and 3 may be modified so that the output voltage Vo is applied, as it is, to the non-inverting input terminal (+) of the comparator 9.

Moreover, the soft-start circuit 32 of the power supply apparatus 1 and the soft-start circuit 36 of the power supply apparatus 51 can be replaced by each other.

Furthermore, the present invention can be applied not only to the power supply apparatus 1 (see FIG. 1) or the power supply apparatus 51 (see FIG. 3) but to power supply apparatuses provided with various switching regulators or DC-DC converters, for example. Still further, the present invention can be applied to power supply apparatuses provided with a series regulator (a dropper-type regulator) such as a three-terminal regulator.

INDUSTRIAL APPLICABILITY

The present invention is suitable for a power supply apparatus, a high-side switch, or the like that require an overcurrent protection function, and in particular for a vehicle-mounted power supply apparatus that requires high reliability or a power supply apparatus that outputs a current to a capacitive load.

What is claimed is:

1. An overcurrent detection circuit that detects an overcurrent state of a switching element that outputs a current to a load, the overcurrent detection circuit comprising:
    a start-up monitoring portion that outputs a steady state signal when a time elapsed after the overcurrent detection circuit starts being fed with electric power exceeds a predetermined time, and that outputs a start-up state signal when the time elapsed after the overcurrent detection circuit starts being fed with electric power is less than the predetermined time;
    an overcurrent monitoring portion that can set two overcurrent detection levels, one of which is a first overcurrent detection level and another of which is a second overcurrent detection level that is greater than the first overcurrent detection level, and that monitors the overcurrent state of the switching element; and
    an output voltage monitoring portion that detects whether an output voltage to the load is normal or abnormal by comparing a voltage commensurate with the output voltage with a predetermined voltage, and then gives a detection result to the overcurrent monitoring portion, wherein
    when the output voltage is abnormal and the steady state signal is outputted, the overcurrent monitoring portion sets the first overcurrent detection level as the overcurrent detection level, and, when the output voltage is normal or the start-up state signal is outputted, the overcurrent monitoring portion sets the second overcurrent detection level as the overcurrent detection level.

2. The overcurrent detection circuit of claim 1, wherein
    the output voltage monitoring portion compares a magnitude of the voltage commensurate with the output voltage with a magnitude of a predetermined detection voltage, and
    when the magnitude of the voltage commensurate with the output voltage is greater than the magnitude of the detection voltage, the output voltage monitoring portion detects that the output voltage is normal, and, when the magnitude of the voltage commensurate with the output voltage is smaller than the magnitude of the detection voltage, the output voltage monitoring portion detects that the output voltage is abnormal, and then gives the detection result to the overcurrent monitoring portion.

3. The overcurrent detection circuit of claim 1, wherein
    the start-up monitoring portion includes a soft-start circuit that controls, while outputting a voltage commensurate with the time elapsed after the overcurrent detection circuit starts being fed with electric power, the switching element in such a way that a soft-start operation is performed so that the output voltage rises gently when the overcurrent detection circuit starts being fed with electric power, and
    based on the voltage outputted from the soft-start circuit, the start-up monitoring portion outputs the steady state signal or the start-up state signal.

4. The overcurrent detection circuit of claim 1, wherein
    based on a voltage generated by a passage of a predetermined current through a capacitive element after the overcurrent detection circuit starts being fed with electric power, the start-up monitoring portion outputs the steady state signal or the start-up state signal.

5. The overcurrent detection circuit of claim 1, wherein
    the first overcurrent detection level and the second overcurrent detection level are determined on a basis of an input voltage to the switching element.

6. The overcurrent detection circuit of claim 1, further comprising:
    a control portion that controls the switching element according to a signal relating to the overcurrent state of the switching element, the signal being outputted from the overcurrent monitoring portion.

7. A power supply apparatus comprising:
    the overcurrent detection circuit of claim 1,
    the switching element; and
    a smoothing circuit that smoothes a voltage at an output side of the switching element, and then outputs the smoothed voltage to the load.

* * * * *